(12) United States Patent
Van Brunt et al.

(10) Patent No.: US 10,103,230 B2
(45) Date of Patent: Oct. 16, 2018

(54) METHODS OF FORMING BURIED JUNCTION DEVICES IN SILICON CARBIDE USING ION IMPLANT CHANNELING AND SILICON CARBIDE DEVICES INCLUDING BURIED JUNCTIONS

(71) Applicant: Cree, Inc., Durham, NC (US)

(72) Inventors: Edward Robert Van Brunt, Morrisville, NC (US); Alexander V. Suvorov, Durham, NC (US); Vipindas Pala, Durham, NC (US); Lin Cheng, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/339,178

(22) Filed: Oct. 31, 2016

(65) Prior Publication Data

US 2017/0084700 A1    Mar. 23, 2017

Related U.S. Application Data

(63) Continuation of application No. 14/297,074, filed on Jun. 5, 2014, now Pat. No. 9,484,413.

(Continued)

(51) Int. Cl.
*H01L 29/16* (2006.01)
*H01L 29/06* (2006.01)
(Continued)

(52) U.S. Cl.
CPC ........ *H01L 29/1608* (2013.01); *H01L 21/046* (2013.01); *H01L 21/047* (2013.01); *H01L 21/26506* (2013.01); *H01L 21/26586* (2013.01); *H01L 21/324* (2013.01); *H01L 29/0619* (2013.01); *H01L 29/0688* (2013.01);

(Continued)

(58) Field of Classification Search
CPC .......................... H01L 29/1608; H01L 21/046
See application file for complete search history.

(56) References Cited

U.S. PATENT DOCUMENTS 5,681,762 A   10/1997   Baliga
5,895,939 A    4/1999   Ueno
(Continued)

FOREIGN PATENT DOCUMENTS

JP    2011-211212 A    10/2011

OTHER PUBLICATIONS

Japanese Office Action Corresponding to Japanese Patent Application No. 2016-530017; dated May 1, 2017; 5 Pages. (Foreign Text Only).

Itoh et al. "Characterization of residual defects in cubic silicon carbide subjected to hot-implantation and subsequent annealing", *Journal of Applied Physics*, vol. 82, No. 11, pp. 5339-5347, Dec. 1, 1997.

(Continued)

*Primary Examiner* — Julio J Maldonado
*Assistant Examiner* — Farun Lu
(74) *Attorney, Agent, or Firm* — Myers Bigel, P.A.

(57) ABSTRACT

A semiconductor device structure according to some embodiments includes a silicon carbide substrate having a first conductivity type, a silicon carbide drift layer having the first conductivity type on the silicon carbide substrate and having an upper surface opposite the silicon carbide substrate, and a buried junction structure in the silicon carbide drift layer. The buried junction structure has a second conductivity type opposite the first conductivity type and has a junction depth that is greater than about one micron.

12 Claims, 9 Drawing Sheets

Related U.S. Application Data

(60) Provisional application No. 61/858,926, filed on Jul. 26, 2013.

(51) Int. Cl.

| | | |
|---|---|---|
| *H01L 29/66* | (2006.01) | |
| *H01L 21/324* | (2006.01) | |
| *H01L 29/78* | (2006.01) | |
| *H01L 29/10* | (2006.01) | |
| *H01L 29/08* | (2006.01) | |
| *H01L 21/04* | (2006.01) | |
| *H01L 29/872* | (2006.01) | |
| *H01L 29/861* | (2006.01) | |
| *H01L 21/265* | (2006.01) | |

(52) U.S. Cl.
CPC ...... *H01L 29/0878* (2013.01); *H01L 29/1095* (2013.01); *H01L 29/6606* (2013.01); *H01L 29/66068* (2013.01); *H01L 29/66712* (2013.01); *H01L 29/7802* (2013.01); *H01L 29/7828* (2013.01); *H01L 29/861* (2013.01); *H01L 29/872* (2013.01); *H05K 999/99* (2013.01)

(56) References Cited

U.S. PATENT DOCUMENTS

| | | | |
|---|---|---|---|
| 6,091,108 | A | 7/2000 | Harris et al. |
| 6,600,192 | B1 | 7/2003 | Sugawara et al. |
| 6,639,273 | B1 | 10/2003 | Ueno |
| 2008/0001159 | A1* | 1/2008 | Ota ............... H01L 29/0623 257/77 |
| 2008/0121895 | A1 | 5/2008 | Sheppard et al. |
| 2008/0185593 | A1* | 8/2008 | Saggio ............. H01L 29/0634 257/77 |
| 2008/0203441 | A1 | 8/2008 | Endo |
| 2009/0072241 | A1 | 3/2009 | Harris et al. |
| 2009/0250705 | A1 | 10/2009 | Watanabe et al. |
| 2010/0032685 | A1 | 2/2010 | Zhang et al. |
| 2011/0198616 | A1 | 8/2011 | Yamashita |
| 2011/0254016 | A1 | 10/2011 | Ryu |
| 2011/0278596 | A1 | 11/2011 | Aigo et al. |
| 2013/0161689 | A1 | 6/2013 | Huo et al. |

OTHER PUBLICATIONS

Janson et al. "Ion implantation range distributions in silicon carbide", Journal of Applied Physics, vol. 93, No. 11, 8903-8909, Jun. 1, 2003.

Cézac et al, "A New Generation of Power Unipolar Devices: the Concept of the Floating Islands MOS Transistor (FLIMOST)," ISPSD 2000, pp. 69-72, May 2000.

Nishio et al, "Ultralow-Loss SiC Floating Junction Schottky Barrier Diodes (Super-SBDs)," IEEE Trans. Elec. Dev., vol. 55, No. 8, pp. 1954-1960, Aug. 2008.

B. J. Baliga, "Fundamentals of Power Semiconductor Devices", *Springer*, 2008, pp. 110.

M.S. Janson, A. Hallen, P. Godignon A. Yu. Kuznetsov, M.K. Linnarsson, E. Morvan and B.G. Swenson, "Channeled Implants in 6H Silicon Carbide", *Materials Science Forum* vols. 338-342 (2000) pp. 889-892.

E. Morvan, N. Mestres, F.J. Campos, J. Pascual, A. Hallen, M. Lionarsso and A.Yu. Kuznetsov, "Damage Reduction in Channeled Ion Implanted 6H—SiC", *Materials Science Forum* vols. 338-342 (2000) pp. 893-896.

PCT International Search Report and Written Opinion dated Nov. 14, 2014 for corresponding PCT International Application No. PCT/US2014/048217 (10 pages).

PCT International Preliminary Report on Patentability dated Feb. 4, 2016 for corresponding PCT International Application No. PCT/US14/048217 (8 pages).

PCT International Preliminary Report on Patentability dated Feb. 4, 2016 for corresponding PCT International Application No. PCT/US14/048202 (17 pages).

E. Morvan, et al. "Channeling implantations of Al+ into 6H Silicon Carbide", *Applied Physics Letters*, A I P Publishing LLC, US, vol. 74, No. 26, 28 (Jun. 28, 1999) pp. 3990-3992.

Wong-Leung J., et al., "Ion Implantation in 4H—SiC," Nuclear Instruments & Methods in Physics Research B: Beam Interactions with Materials and Atoms, vol. 266, No. 8 (Dec. 23, 2007), pp. 1367-1372.

E. Morvan et al., "Lateral Spread of Implanted Ion Distributions in 6H—SiC: Simulation," Materials Science and Engineering: B, Elsevier, Amsterdam, NL, vol. 61-62, Jul. 30, 1999, pp. 373-377.

Extended European Search Report for corresponding EP Application No. 14829761.7, dated Feb. 3, 2017 (9 pages).

\* cited by examiner

METHODS OF FORMING BURIED JUNCTION DEVICES IN SILICON CARBIDE USING ION IMPLANT CHANNELING AND SILICON CARBIDE DEVICES INCLUDING BURIED JUNCTIONS

RELATED APPLICATIONS

The present application is a continuation of U.S. patent application Ser. No. 14/297,074, filed Jun. 5, 2014 and entitled Methods of Forming Buried Junction Devices in Silicon Carbide Using Ion Implant Channeling and Silicon Carbide Devices Including Buried Junctions, which itself claims the benefit of and priority to U.S. Provisional Patent Application No. 61/858,926, filed Jul. 26, 2013 and entitled "Controlled Ion Implantation Into Silicon Carbide Using Channeling And Devices Fabricated Using Controlled Ion Implantation Into Silicon Carbide Using Channeling", the disclosures of which are incorporated herein by reference in their entireties.

STATEMENT OF U.S. GOVERNMENT INTEREST

This invention was made with Government support under Contract No. W911NF-10-2-0038 awarded by Army Research Laboratory. The Government has certain rights in the invention.

FIELD

The present invention relates to semiconductor device fabrication, and, more particularly, to ion implantation for fabricating semiconductor devices.

BACKGROUND

Ion implantation is a semiconductor device fabrication technique that may be used to change the electronic properties of a semiconductor wafer by adding specific dopants to the wafer. More particularly, in conventional ion implantation, a desired ion species to be implanted into the wafer may be ionized, accelerated to a predetermined kinetic energy, and directed as an ion beam towards the surface of a semiconductor wafer loaded in an ion implantation target chamber. Based on the predetermined kinetic energy, the desired ion species may penetrate into the semiconductor wafer to a certain depth. As such, ions may be embedded (i.e., implanted) into the semiconductor wafer, which may thereby alter the electrical properties of the semiconductor wafer.

SUMMARY

A semiconductor device structure according to some embodiments includes a silicon carbide substrate having a first conductivity type, a silicon carbide drift layer having the first conductivity type on the silicon carbide substrate and having an upper surface opposite the silicon carbide substrate, and a buried junction structure in the silicon carbide drift layer. The buried junction structure has a second conductivity type opposite the first conductivity type and has a junction depth that is greater than about one micron.

The buried junction structure may include a buried region having the second conductivity type. The buried junction structure may have a thickness of about 0.1 microns to about 3 microns.

The silicon carbide drift layer may include an upper drift layer and a lower drift layer. The lower drift layer is between the substrate and the upper drift layer, and the upper drift layer has a thickness that may be greater than about one micron. The upper and lower drift layers may be separated by the buried junction structure.

The buried junction structure has a junction depth, and the semiconductor device has a radius of curvature that is equal to a thickness of the lower drift layer less the junction depth of the buried region.

The junction depth of the buried junction structure may be greater than about 2 microns, and in some embodiments greater than about 4 microns.

The buried junction structure may include a plurality of buried regions arranged in a grid. The plurality of buried regions may be electrically isolated from one another.

The buried junction structure may include a first buried junction structure having a first junction depth, and the semiconductor device further includes a second buried junction structure having a second junction depth that is different from the first junction depth.

The first and second buried junction structures may be electrically isolated from one another.

The semiconductor device may further include a junction termination structure adjacent an active region of the device.

The junction termination structure may include a guard ring and/or a junction termination extension region.

The buried junction structure may include a first buried junction structure having a first junction depth, and the semiconductor device further includes a second buried junction structure having a second junction depth that may be greater than the first junction depth.

Methods of forming an electronic device according to some embodiments include providing a silicon carbide drift layer having a first conductivity type and a first doping concentration and having a crystallographic axis, and implanting dopant ions to form a buried junction structure in the silicon carbide drift region. The buried junction structure has a second conductivity type that is opposite the first conductivity type and has a second doping concentration that may be greater than the first doping concentration. Implanting the dopant ions includes implanting the dopant ions at an implant angle between a direction of implantation and the crystallographic axis of less than about 2°.

In some embodiments, the implant angle may be greater than 0.1°, and in some embodiments, the implant angle may be between 0.1° and 1°. In further embodiments, the implant angle may be between 0.1° and 5°.

The drift layer may have a thickness of from about 15 microns to about 200 microns.

The buried junction structure may have a junction depth of from about 2.5 microns to about 4.5 microns into the drift layer, and a doping concentration of from about 1E17 $cm^{-3}$ to about 1E20 $cm^{-3}$.

The methods may further include forming a junction termination structure adjacent an active region of the device.

The buried junction structure may include a first buried junction structure having a first junction depth, the method further including forming a second buried junction structure in the drift layer, the second buried junction structure having a second junction depth that is different from the first junction depth.

DETAILED DESCRIPTION

Figure 1:
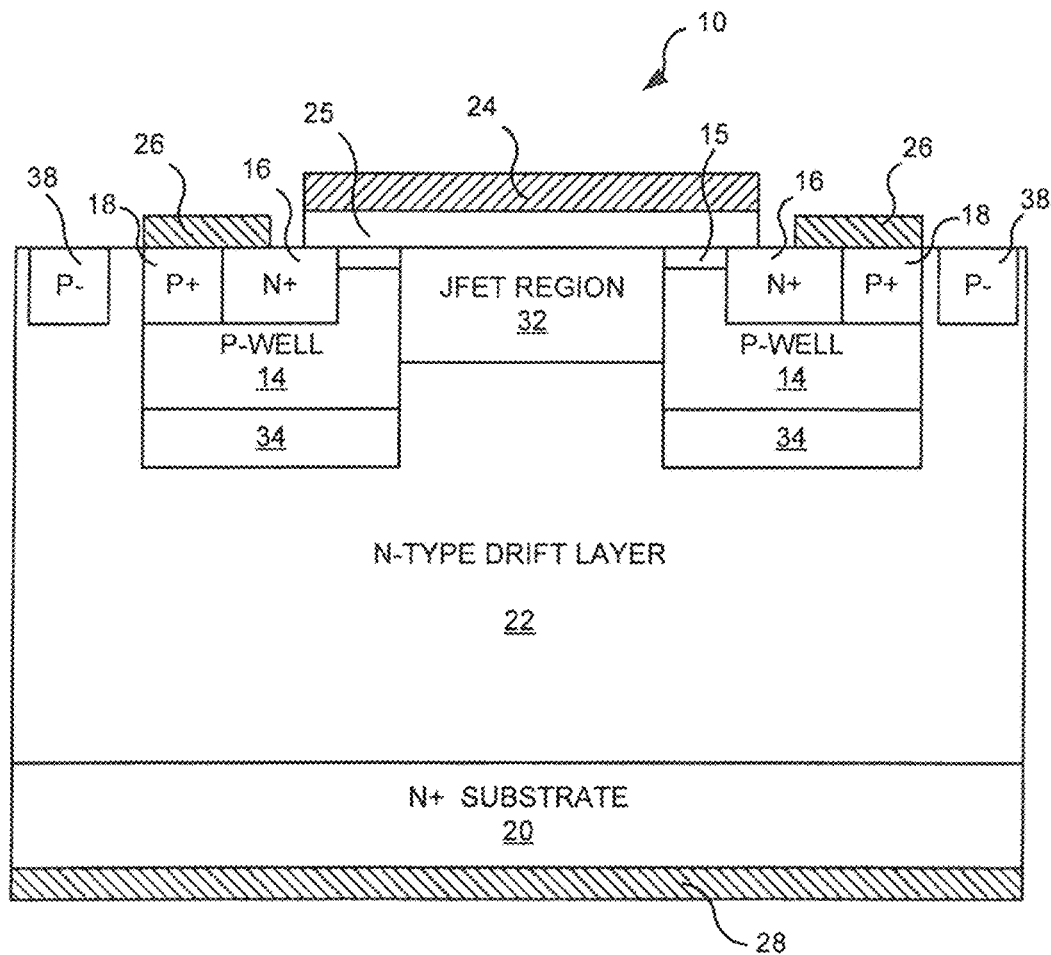
FIG. 1 is a schematic block diagram of a device structure that can be fabricated in accordance with some embodiments.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation, of, for example, light elements such as boron and/or beryllium, may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entirety.

The fabrication of semiconductor devices in silicon carbide is difficult, partly due to the high temperatures needed for many device fabrication processes. For example, growth temperatures and annealing temperatures are significantly higher in silicon carbide than in other material systems, such as silicon. In addition, fabrication of silicon carbide devices is made more difficult by the high thermal stability of dopant atoms in silicon carbide. In particular, the high thermal stability of dopant atoms in silicon carbide means that dopant diffusion, a common doping technique in silicon-based device fabrication, is not generally useful in silicon carbide.

Accordingly, in fabricating silicon carbide devices, it is often necessary to use other techniques, such as epitaxial growth/regrowth and ion implantation, to form doped regions in silicon carbide.

The use of epitaxial growth/regrowth and lithography to form doped regions in silicon carbide, while useful, is time consuming and expensive. Such techniques also often require time consuming alignment steps, and may not be suitable for forming all regions needed for device fabrication.

Ion implantation is a flexible and convenient method for selectively doping portions of a silicon carbide layer. In an ion implantation process, dopant ions are accelerated to a high energy, usually expressed in keV or MeV, and directed towards a semiconductor lattice. The implants penetrate the lattice and come to rest somewhere within the lattice. The number of ions implanted into a semiconductor layer, referred to as the dose, is usually expressed in terms of ions per square centimeter ($cm^{-2}$). Selective implantation is performed by masking portions of the layer to prevent ions from penetrating the masked portions of layer.

However, ion implantation has certain well-known drawbacks. In particular, when dopant ions are implanted into a semiconductor layer, the ions cause irradiation damage to the crystal lattice of the semiconductor layer. To repair the lattice damage, the structure must be annealed at relatively high temperatures (e.g. greater than 1200° C., and in some cases greater than 1600° C.). Even with high temperature annealing and/or long anneal times, some lattice damage may remain.

Moreover, conventional ion implantation may not be attractive for use in forming deep implanted regions, or regions requiring a high level of doping uniformity by depth. Implant range, refers to the average depth of implanted ions. The depth of implanted ions is directly related to the energy of the implant, i.e., ions implanted into a semiconductor layer at higher energies tend to go deeper into the layer. Thus, forming deep implanted regions requires high energy implants. However, lattice damage is also directly related to implant energy: higher energy implants also tend to cause more lattice damage than lower energy implants. High energy implants also require thick mask layers, which can cause undesirable shadowing of implants.

As used herein, implant depth refers to the depth of the implanted region, which is greater than the depth at which the peak implant concentration occurs. In particular, implant depth refers herein to the depth at which the concentration of implanted dopants falls below $10^{14}$ cm$^{-3}$. Note that the implant depth may not correspond to the junction depth of a p-n junction formed by the implanted region, as p-n junction location is affected by the doping levels of neighboring regions.

Moreover, to form implanted regions that have good doping uniformity by depth, it is necessary to perform multiple implantation steps with multiple energies and dosages. Each implant step increases the time and cost needed to fabricate the structure.

Embodiments of the present invention are based on a realization that implant channeling can be used to controllably form implanted regions in silicon carbide that are highly uniform by depth using lower energy implants which result in reduced lattice damage. According to some embodiments, the depth of a channeled implant can be controlled by performing the implant at an elevated temperature, which can reduce the depth of the implant. The depth of the implant can also be controlled by altering the angle of the implant. Reducing the lattice damage can reduce the temperature and/or time of the post implant anneal, which can increase fabrication throughput and/or decrease fabrication costs.

Channeling is a phenomenon experienced when ions are implanted along a crystal axis of a semiconductor. When ions are implanted into a crystal lattice, the implanted ions tend to scatter when they impact atoms in the crystal lattice (referred to as impact scattering). When the direction of implantation is oriented at an oblique angle to the major axes of the crystal lattice, the atoms in the lattice appear to have a random distribution relative to the direction of implantation. The likelihood of collisions between implanted ions and atoms in the crystal lattice is thus fairly uniform with increasing depth. If, however, direction of implantation is close to a major axis of the crystal lattice, the atoms in the crystal lattice appear to "line up" relative to the direction of implantation, and the implanted ions appear to travel down the channels created by then crystal structure. This reduces the likelihood of collisions between the implanted ions and the atoms in the crystal lattice, especially near the surface of the semiconductor layer. As a result, the depth of the implant is greatly increased.

Ordinarily, it is not desirable for the depth of the implant to be increased by channeling, as the depth of the implant may be greater than the desired depth of the implanted region. Because it is difficult to control the depth of a channeled implant using conventional techniques. Thus, in silicon carbide processing for example, it is conventional when implanting ions at an angle that is near a crystallographic axis of the semiconductor layer, to form a sacrificial layer, such as silicon dioxide, on the layer to be implanted, and to implant the semiconductor layer through the amorphous layer. The screen layer has the effect of randomizing the direction of the implanted ions, thereby reducing the channeling effect of the underlying lattice structure.

In general, channeling occurs in silicon carbide when the direction of implantation is within about 2° of a crystallographic axis of the silicon carbide crystal. When the direction of implantation is more than about 2° of a crystallographic axis of the silicon carbide crystal, the atoms in the lattice appear to be randomly distributed relative to the direction of implantation, which reduces channeling effects. As used herein, the term "implant angle" refers to the angle between the direction of implantation and a crystallographic axis, such as the c-axis or <0001> axis, of the semiconductor layer into which ions are implanted. Thus, an implant angle of less than about 2° relative to the c-axis of a silicon carbide layer is expected to result in channeling.

Some embodiments utilize channeled implants for implantation of shallow and/or deep implanted regions in silicon carbide. The depth of the channeled implants may be controlled by controlling the temperature of the implantation and/or through precise control of the direction of implantation relative to the crystallographic axes of the semiconductor layer.

An exemplary structure that may be formed using embodiments described herein is illustrated in FIG. 1. The device 10 shown in FIG. 1 is a MOSFET device having various regions that can be formed by ion implantation. However, it will be appreciated that embodiments disclosed herein can be advantageously employed to form various regions of many different kinds of semiconductor devices, including, for example, metal semiconductor field effect transistors (MESFETs), insulated gate bipolar transistors (IGBTs), Schottky diodes, PIN diodes, etc. Moreover, although certain layers of the device 10 of FIG. 1 are described as having a specified conductivity type (i.e., n-type or p-type), it will be appreciated that the conductivity types of the layers could be reversed (e.g., layers and/or regions designated as n-type could be p-type, and vice versa). The exemplary structure 10 includes an n-type drift layer 22 on an n+ substrate 20. The substrate 20 may, for example, include a single crystal silicon carbide layer having the 4H or 6H polytype, although other polytypes may be used. Moreover, the substrate may have an off-axis orientation of about 2° to about 10°. That is, the c-axis of the hexagonal crystal structure of the silicon carbide crystal may be slightly tilted relative to a direction normal to the substrate surface.

The n-type drift layer 22 may have a doping concentration of about 1E14 cm$^{-3}$ to about 5E16 cm$^{-3}$.

P-type wells 14 are provided at an upper surface of the drift layer. The p-type wells 14 may be doped, for example, with p-type dopants, such as aluminum and/or boron ions, at a concentration of about 1E16 cm$^{-3}$ to 1E19 cm$^{-3}$. The p-type wells 14 have a junction depth of about 0.3 microns to 1.2 microns. Deep p-regions 34 are formed beneath the p-type wells 14. The deep p-type regions 34 may be doped, for example, with p-type dopants, such as aluminum and/or boron ions, at a concentration that is higher than the concentration of the p-type wells 14.

P− guard rings 38 are formed at a periphery of the device at the surface of the drift layer 22. The P− guard rings 38 may be formed to a depth of about 0.5 to 1.5 microns, and may be doped, for example, with p-type dopants, such as aluminum and/or boron ions, at a concentration of about 1E15 $cm^{-3}$ to 1E16 $cm^{-3}$.

A junction field effect transistor (JFET) region 32 is formed between the p-type wells 14. The JFET region 32 may have a thickness of about 0.5 microns to 1.5 microns may be doped, for example, with n-type dopants, such as nitrogen and/or phosphorus ions at a concentration of about 1E15 $cm^{-3}$ to 5E17 $cm^{-3}$.

N+ source regions 16 are formed in the p-well regions 14 and are spaced apart from the JFET region 32 to define channel regions 15 between the n+ source regions and the JFET region. The n+ source regions 16 may be doped, for example, with n-type dopants, such as nitrogen and/or phosphorus ions, at a concentration of about 5E18 $cm^{-3}$ to 1E21 $cm^{-3}$. The n+ source regions 16 may have a depth of about 0.2 microns to 1.2 microns.

The channel regions 15 may be implanted with p-type or n-type dopants as desired to obtain a desired threshold voltage. In particular, the channel regions 15 may be doped, for example, with p-type dopants, such as aluminum and/or boron ions, at a concentration of about 1E17 $cm^{-3}$ to 2E18 $cm^{-3}$. The channel regions 15 may have a depth of about 50 nm to 300 nm.

P+ well contact regions 18 are formed in the p-well regions 14 adjacent the n+ source regions. The p+ well contact regions 18 may have a depth of about 0.2 microns to 1.2 microns and may be doped, for example, with p-type dopants, such as aluminum and/or boron ions, at a concentration of about 5E18 $cm^{-3}$ to 1E21 $cm^{-3}$.

A gate insulator 25, such as silicon dioxide, is provided on the drift layer 22 and extends from the n+ source layers 16 over the channel regions 15 and the JFET region 32. A gate contact 24, which may include polysilicon with a metal overlayer, is on the gate insulator 25.

Source ohmic contacts 26 are formed on the n+ source regions 16 and the p+ well contact regions 18, and a drain ohmic contact 28 is formed on the substrate 20.

For current to flow from the source contacts 26 to the drain contact 28, across the drift layer 22, a sufficient voltage may be applied to the gate contact 24 to create an inversion layer in the channel region 15 so that n-type carriers from the source regions 16 can traverse the well regions 14 and cross the drift region 22 and the substrate 20 to the drain contact 28.

As will be appreciated from the foregoing discussion, many of the regions of the device 10 of FIG. 1 can be advantageously formed by selective ion implantation. For example, the well regions 14, the source regions 16, the well contact regions 18, the JFET region 32 and the channel regions 15 can all be formed using ion implantation. These regions have widely varying depths and doping concentrations. Conventionally, the deeper regions, such as the JFET region 32 and the well regions 14 would be formed using multiple implant steps with a silicon dioxide mask layer to reduce/prevent channeling effects.

For example, a conventional device processing recipe may call for a deep p-type implant. It has been found that implanting $^{27}$Al ions at 360 keV results in unacceptably high levels of lattice damage, particularly at the End of Distribution (EOD), i.e. the deepest penetration of the ions, as well as at the sides of the implant pattern. As a result, it has been necessary to form the deep p-type regions 34 using multiple implant steps of double ionized $^{27}$Al++ ions, which requires ten times more time to perform the implant. The channel implants and JFET region implants also suffer from unacceptable levels of lattice damage at the EOD and sides of the implant pattern. Some embodiments enable the formation of deep implants in silicon carbide using low energy ion implantation.

Figure 2:
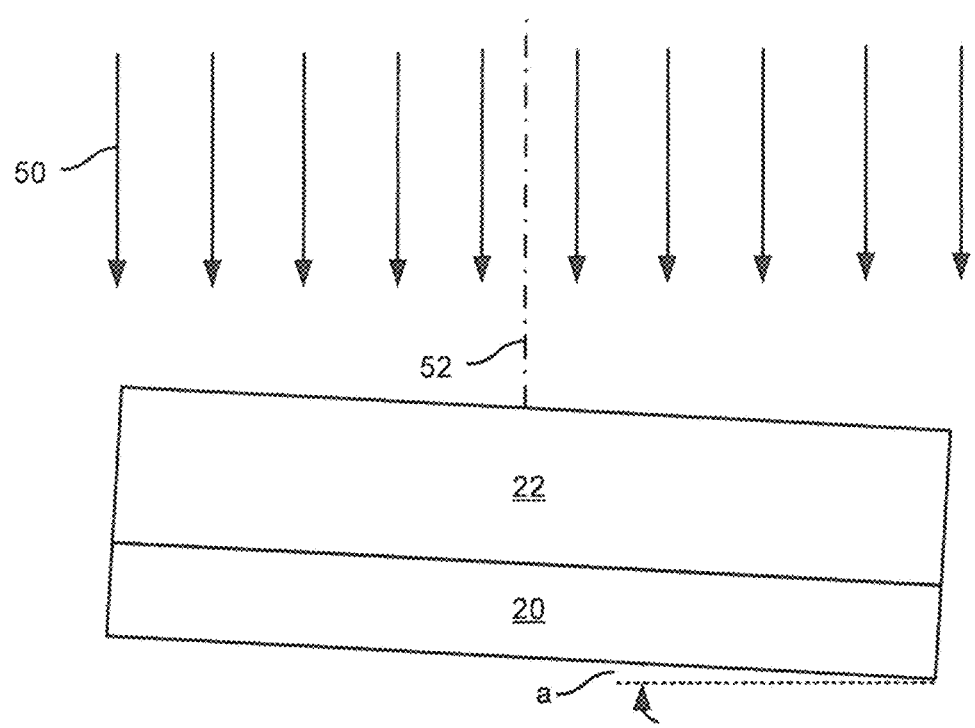
FIG. 2 is a schematic diagram illustrating channeled ion implantation in accordance with some embodiments.

According to some embodiments, channeled ion implantation may be used to form one or more doped regions in a silicon carbide semiconductor device. Referring to FIG. 2, a silicon carbide substrate 20 on which an epitaxial layer 22 is formed may be implanted with ions 50. The direction of implantation may be substantially parallel to the c-axis of the hexagonal semiconductor lattice of the substrate 20 and the epitaxial layer 22. As used herein, substantially parallel means that the direction of implantation is less than 2° different from the direction of the c-axis of the semiconductor lattice.

As noted above, the silicon, carbide substrate 20 and the epitaxial layer 22 formed thereon may have an off-axis orientation of, for example, 2° to 10°. Thus, as illustrated in FIG. 2, the c-axis 52 of the silicon carbide substrate 20 may be aligned with the direction of travel of the implants 50 by tilting the substrate 20 at a tilt angle a that is equal to the off-axis angle of the substrate. The angle of implantation can be tightly controlled (to a resolution, for example, of 0.1°) using Rutherford backscattering to align the substrate with the implant beam.

An implant mask (not shown) may be provided on the epitaxial layer 22 to define regions of the epitaxial layer that are to be implanted.

High temperature ion implantation may be performed in an apparatus as described, for example, in U.S. Pat. No. 7,547,897, entitled "High-temperature ion implantation apparatus and methods of fabricating semiconductor devices using high-temperature ion implantation," assigned to the assignee of the present application, the disclosure of which is incorporated herein by reference as if fully set forth herein.

According to some embodiments, various doped regions in a silicon carbide device structure can be formed by implanting ions directly into a silicon carbide layer without first passing through a screen layer and substantially in alignment with a crystallographic axis of the silicon carbide layer to result in channeling effects. The implant may be performed at a temperature that is greater than room temperature and that is selected to provide a desired depth of implant.

The depth of the implant may also be controlled by precisely controlling the tilt angle of the wafer relative to the implant direction. For example, by increasing the temperature of implantation, it may be possible to reduce the depth of channeled implants. By implanting the ions at an angle that is slightly tilted relative to the crystallographic axis, for example at an angle greater than 0° and less than about 2°, the depth of the implant can be controlled further.

Highly uniform doping can be obtained for channeled implants. However, as the dose of the implant increases, a secondary peak may begin to appear near the surface. This may be attributed to increased lattice damage caused by high fluences of dopant ions.

Channeled implants may have significantly greater depths than non-channeled implants. Implant depth can be controlled by carefully controlling the tilt angle of the implantation. Rotation angle during implantation may also affect dopant distributions of channeled implants.

Moreover, the channeled implants performed at high temperatures (e.g. 500° C. may have a significantly shorter depth than the channeled implants performed at room temperature. In addition, channeled implants performed at elevated temperature may have a slightly shorter depth but better doping uniformity than the channeled implants performed at room temperature.

According to some embodiments, a silicon carbide layer may be implanted with ions at an implant angle less than 2° at an implant energy less than about 100 keV and a temperature greater than 300° C. to provide an implanted region having a depth that is less than about 1 micron, in some cases less than about 0.5 microns, in some cases less than about 0.3 microns, in some cases less than about 0.2 microns, and in some cases less than about 0.1 microns. In some embodiments, the implantation may be performed at a temperature greater than 400° C., in some embodiments at a temperature greater than 600° C., in some embodiments at a temperature greater than 1000° C., and in some embodiments at a temperature greater than 1100° C. In some cases, the silicon carbide layer may be implanted at an implant angle that is less than 1°, in some cases less than 0.5°, in some cases between 0.1° and 0.5°, and in some cases less than 0.1°.

In sonic embodiments, the ions may be implanted at a dose that is less than 1E13 cm$^{-2}$.

Although not wishing to be bound by a particular theory, it is presently believed that when ion implantation is performed on a semiconductor layer, two types of defects are introduced into the semiconductor layer. The first type of defect (Type I defects) is caused when implanted ions break bonds of the atoms in the lattice structure of the semiconductor layer. The second type of defect (Type II defects) is a defect in the location of the implanted ions themselves, as the implanted ions may not come to rest at an electrically active position within the semiconductor lattice. Annealing repairs the lattice damage caused by the ion implantation, and also encourages the implanted ions to move to electrically active sites in the semiconductor lattice. High temperature implantation tends to reduce the occurrence of Type I defects, while channeling tends to reduce the occurrence of Type II defects.

Thus, a semiconductor layer implanted using high temperature channeled implants may require an anneal for a time and/or temperature that may be significantly lower than would otherwise be required for a similar depth implant due to the reduced lattice damage caused by the low energy, high temperature channeled implants. In some cases, the time-temperature product of the anneal may be more than ten times lower than would otherwise be required for a similar depth implant. In particular embodiments, the semiconductor layer may be annealed at a temperature of less than about 1000° C. for a time of less than about 30 hours to activate the implanted channeled ions.

In particular embodiments, the implant angle may be controlled to within 0.1° accuracy to obtain a controllable result. Such accuracy is obtainable, for example, with the VIISTa 810 ion implanter manufactured by Varian Semiconductor Associates, Gloucester Mass., USA.

It will be noted that in silicon device processing, high temperature channeled ion implantation is not expected to have similar effects as high temperature channeled ion implantation in silicon carbide. Silicon is generally less robust than silicon carbide, thus is more susceptible to lattice damage during ion implantation than silicon carbide, even when the implantation is channeled. This lattice damage tends to close the channels, limiting the depth of the implants. However, it will be noted that even in silicon carbide, lattice damage can limit the implant depth of channeled implants as the dose is increased. For example, M. Janson, et al, "Channeled implants in 6 H Silicon Carbide," Mat, Sci. For. Vols. 338-342 (2000), pp, 889-892 describes the dependence of implant depth on dose for high energy (>1 MeV) channeled implants. Janson et al. note that at 1.5 MeV implant energies, the implant range of $^{27}$Al implants begins to become dependent on dose at about $11\times10^{12}$ cm$^{-2}$. A similar effect can be observed for 200 keV implants in 4H—SiC.

Moreover, due to its crystal structure silicon experiences better crystallographic reconstruction after implantation than silicon carbide. In particular, silicon has a diamond cubic crystal structure that organizes vertically in the lattice. Thus, it is preferable with silicon to use high energy implants that amorphize the silicon atoms. The crystal structure of silicon can then be reconstructed by annealing. Silicon carbide, on the other hand, has a hexagonal crystal structure that organizes laterally. For example, epitaxial crystal growth in silicon carbide occurs by a lateral step-flow mechanism. It is therefore not desirable to amorphize the silicon carbide lattice, as it is difficult for the lattice to be reconstructed in the desired polytype, even with high temperature annealing.

Figure 3:
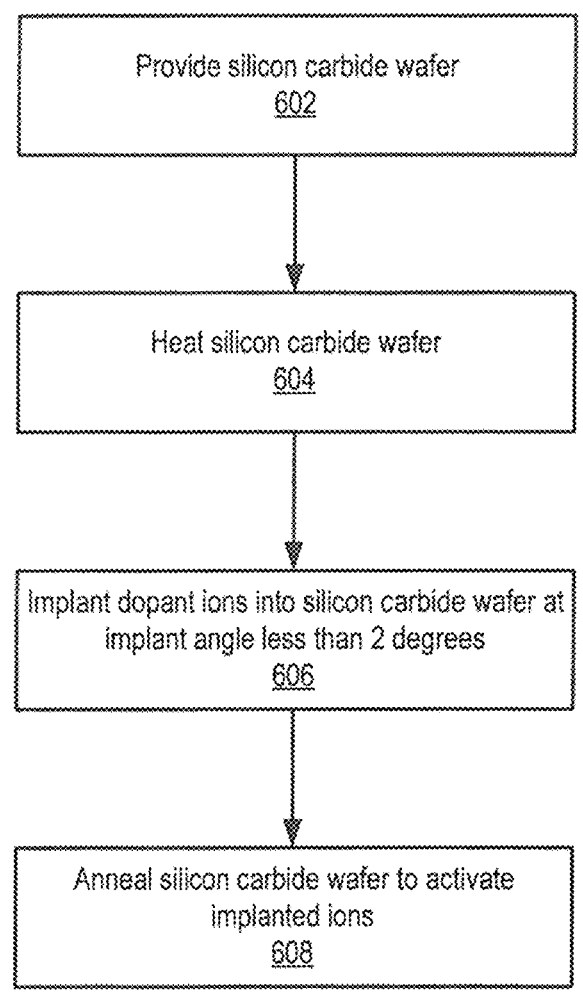
FIG. 3 is a block diagram illustrating operations according to some embodiments.

FIG. 3 is a block diagram illustrating operations for implanting silicon carbide layers according to some embodiments. As shown therein, operations according to some embodiments include providing a silicon carbide layer (block 602), heating the silicon carbide layer to a temperature of greater than 400° C., in some cases greater than 600° C., in some cases greater than 1000° C., and in some cases greater than 1100° C., (block 604), implanting dopant ions into the heated silicon carbide layer at an implant angle of less than about 2° (block 606), and annealing the silicon carbide layer to activate the implanted ions (block 608). In particular, the silicon carbide layer may be annealed at a time-temperature product of less than about 30,000° C.-hours to activate the implanted ions. For example, an anneal carried out for 30 hours at 1000° C. would have a time-temperature product of 30,000° C.-hours. In some cases, the silicon carbide layer may be annealed at a time-temperature product of less than about 25,000° C.-hours to activate the implanted ions, and in some cases, the silicon carbide layer may be annealed at a time-temperature product of less than about 20,000° C.-hours to activate the implanted ions.

In some embodiments, the silicon carbide layer may be annealed at a temperature of less than 1200° C., in some cases less than 1100° C., in some eases less than 1000° C., and in some cases less than 600° C.

Some further embodiments of power semiconductor devices that incorporate channeled implants in silicon carbide will now be described. In vertical power devices, the blocking voltage rating of the device is determined by the thickness and the doping of the drift region. Typically, during the design phase, a desired blocking voltage rating is selected, and then the thickness and doping of the drift region are chosen based on the desired blocking voltage rating.

When vertical power semiconductor devices are operated in the blocking (i.e., non-conducting) mode, the electric field profile in the drift region is triangular, with the peak of the electric field appearing close to the P-N junction. For reducing the ON resistance of the drift region, it is desirable to increase the doping concentration in the drift region. However, as the doping concentration of the drift region increases, the peak electric field in the drift region in the blocking mode of operation also increases. The increase in peak electric field reduces the breakdown voltage of the device in the blocking mode. Thus, there is a tradeoff between ON resistance and blocking voltage for such devices due to the relationship between the blocking voltage and the doping level of the drift layer. However, for a desired blocking voltage, there may be an optimal selection of drift layer doping and drift layer thickness that minimizes the drift resistance. This is known as the one-dimensional unipolar limit for 4H—SiC.

The use of high implant energies to form deeply implanted regions may be enhanced using channeling. Ordinarily, high energy implants are believed to be detrimental to device performance because of the increased lateral distribution of implanted ions, as well as the increased concentration of end-of-range defects (ERDs) introduced into the semiconductor lattice as a result of the high energy implants. The use of channeling to increase the implant range may reduce ERDs, and may also reduce the lateral distribution of implants, which provides better process control and smaller feature sizes. In addition, thinner implant masks may be used when channeled implantation is performed, because the implant energies may be lower than would otherwise be required to achieve similar implant ranges.

End-of-range defects are believed to have a large impact on device performance. Because channeling reduces ERDs, the use of channeling may have a significant impact on device performance. Moreover, because of the relative strength of the silicon carbide lattice, silicon carbide is expected to handle channeled implants without significant lattice damage much better than conventional semiconductor materials, such as silicon.

For channeled implants at lower energies, e.g. about 10 keV or lower, it is believed that most of the ion collisions that limit the implant range are nuclear collisions, i.e., collisions with atomic nuclei in the lattice. This increases the amount of implant damage suffered by the semiconductor crystal lattice. Conversely, it is believed that for higher energy (i.e., deeper) channeled implants, the implanted ions experience relatively more collisions with the electron cloud within the semiconductor lattice, resulting in less lattice damage. Thus, from the standpoint of lattice damage, channeled implants behave very differently from non-channeled implants. For non-channeled implants, the amount of lattice damage caused by the implantation generally increases with implant energy. Therefore, channeled implants may be particularly well suited for forming very deep implanted regions, e.g. 2.5 microns or greater.

Figure 4:
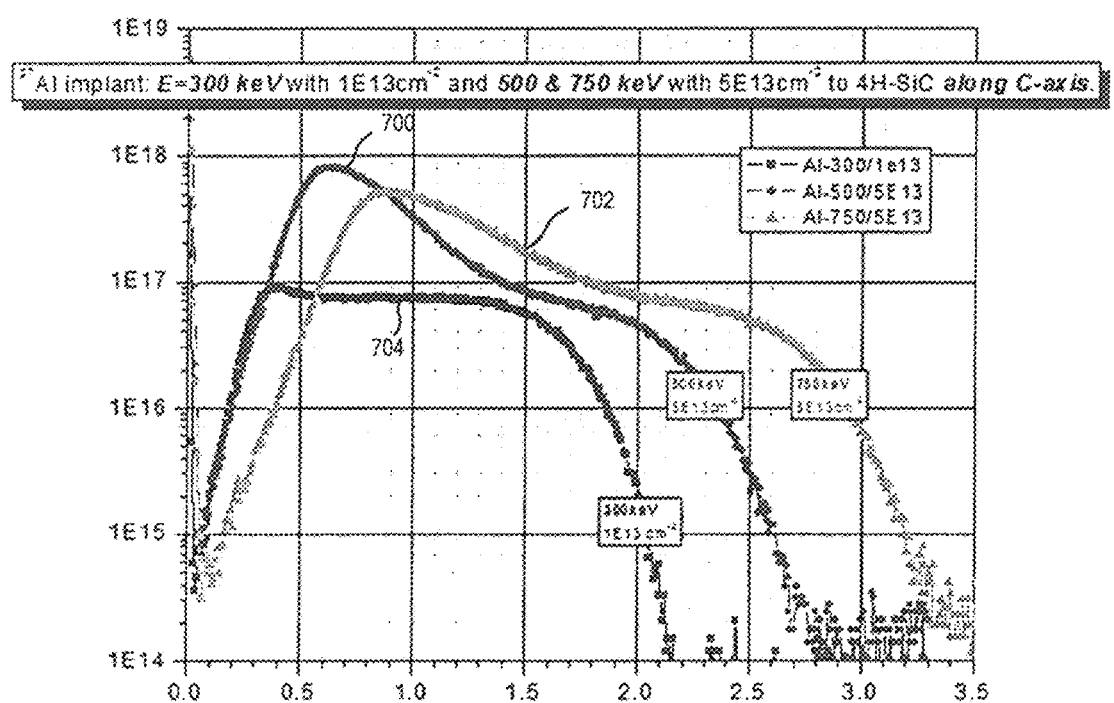
FIG. 4 is a graph illustrating SIMS analysis data for $^{27}$Al ions implanted at various implant energies with channeling into a 4H—SiC wafer at room temperature.

FIG. 4 shows a distribution of channeled implanted $^{27}$Al in a 4H—SiC wafer along the C-axis, as measured by secondary ion mass spectroscopy (SIMS). The implants were performed at room temperature with energy levels of 300, 500 and 750 keV and doses of 1E13 cm$^{-2}$ and 5E13 cm$^{-2}$. In particular, curve 700 shows the measured distribution of Al atoms implanted at an energy of 500 keV and a dose of 5E13 cm$^{-2}$, curve 702 shows the measured distribution of Al atoms implanted at an energy of 750 keV and a dose of 5E13 cm$^{-2}$, and curve 704 shows the measured distribution of Al atoms implanted at an energy of 300 keV and a dose of 1E13 cm$^{-2}$.

The implants illustrated in FIG. 4 were performed without an SiO$_2$ screen layer directly on the surface of the SiC wafer. For such implant energies, the expected penetration depth Rp for $^{27}$Al without channeling would be; Rp=0.33 μm for 300 keV; Rp=0.52 μm for 500 keV; Rp=0.71 μm for 750 keV. The channeling condition enabled the implanted Al atoms to extend about four times deeper into the wafer with a flat concentration of about 7E16 cm$^{-3}$, which is reasonable for a deep p-type doping level.

As illustrated in FIG. 4, the implant distribution represented by curve 700 (500 keV @5E13 cm$^{-2}$) has a higher implant peak than the implant distribution represented by curve 702 (750 keV @5E13 cm$^{-2}$). The higher peak of curve 700 may indicate that greater lattice damage occurred with the lower energy implant than the higher energy implant.

As described above, a channeling implant process is difficult to control in some types of implant devices. The ion channeling process requires a high degree of parallelism of the ion beam and precise orientation of the wafer to the ion beam direction in the ion implant device, especially when processing large diameter wafers. Tight control of these parameters may enable a consistent doping distribution, which helps to achieve proper and reproducible results. The use of channeled implants as described herein can also reduce the need for multiple implants to achieve a specified sheet resistance.

When channeling is not utilized, it may be possible to obtain deep implants using high implant energies. For example, deep p-type implants may be obtained using single condition implantation of $^{27}$Al ions at an implant energy of 360 keV. The implant may be performed using a "screen" SiO$_2$ layer to obtain a reproducible distribution of implanted ions in the target wafer while holding the target wafer at an orientation of about 4 degrees-off from the C-axis toward the (11-20) axis. However, such implant conditions may result in an unacceptably high degree of lattice damage at the ions' End Of Distribution (EOD), as well as side damage in the lateral directions.

Using channeling implants along the C-axis to form some features of a SiC-based device can reduce the number of implant steps required to obtain a deep dopant distribution and at the same time reduce lattice damage. Reduced lattice damage may also reduce the post implant-anneal temperature and/or anneal time.

Channeled implants can be used advantageously to form devices having buried junctions, such as "floating" grids buried within the drift layer. Buried junction structures can reduce the drift region resistance for high voltage devices by a factor of two or more, depending on the number of floating junction grids used.

Figure 5:
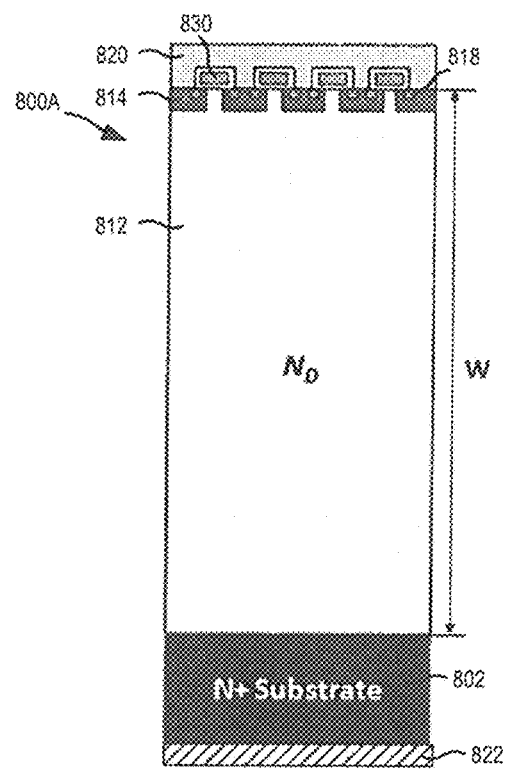
FIG. 5 is a schematic block diagram illustrating a conventional DMOSFET structure

FIG. 5 illustrates a conventional MOSFET device structure 800A without a buried junction structure. The device 800A includes an n+ 4H—SiC substrate 802 on which an n-epitaxial 4H—SiC drift layer 812 is formed. P-type well regions 814 are formed at an upper surface of the drift layer 812 opposite the substrate 802, and n+ source regions 818 are formed in the p-type well regions 814. One or more gate structures 830 are formed on the surface of the drift layer, and source and drain contacts 820, 822 are formed on the device. In the conventional structure 800A, the drift layer 812 is characterized by a width W, which is the distance from the surface of the drift layer to the substrate, and a doping concentration $N_D$. The width W and doping concentration $N_{D1}$ are selected based on the desired reverse blocking voltage of the device. Typical values of W are from 15 microns up to 200 microns or greater. Typical values of $N_D$ are 1E16 cm$^{-3}$ to 1E17 cm$^{-3}$.

Figure 6:
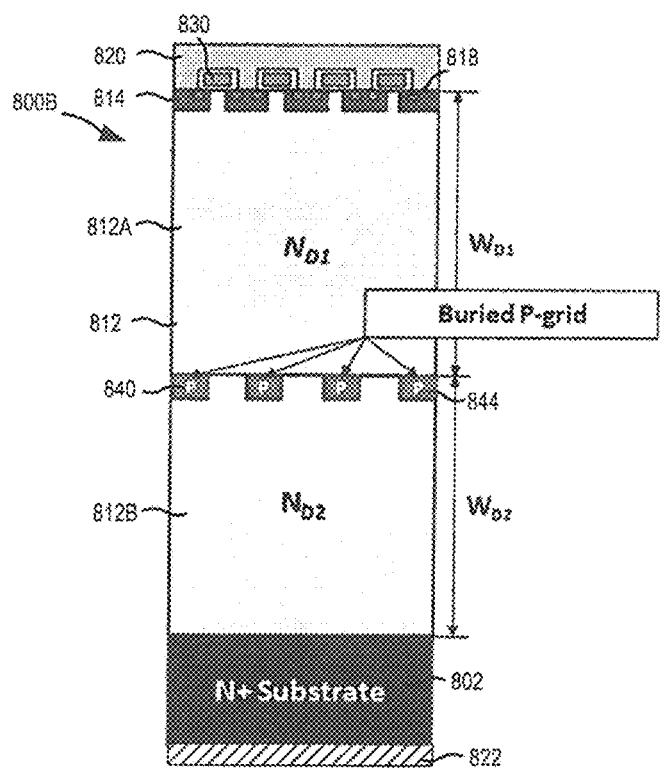
FIG. 6 is a schematic block diagram illustrating a DMOSFET structure including a buried junction according to some embodiments.

FIG. 6 illustrates a MOSFET device structure 800B that includes a buried junction structure. The device 800B also includes an n+ substrate 802 on which an n-drift layer 812 is formed. P-type well regions 814 are formed at an upper surface of the drift layer 812 opposite the substrate 802, and n+ source regions 818 are formed in the p-type well regions 814. One or more gate structures 830 are formed on the surface of the drift layer, and source and drain contacts 820, 822 are formed on the device.

The device further includes a buried junction structure 840 comprising a grid of buried p-type regions 844. The buried p-type regions 844 may be electrically floating, i.e., not conductively connected to one another or to any other portion of the device. The buried p-type regions 844 have an opposite conductivity as the drift layer, and form a built-in p-n junction with the drift layer 812. For example, when formed in an n-type drift layer 812, the buried p-type regions 844 may be formed using implants of aluminum and/or boron.

The buried p-type regions 844 may have a doping concentration that is greater than the doping concentrations of the upper and lower drift layers 812A, 812B. For example, the buried p-type regions 844 may have a doping concentration of about $1E17$ cm$^{-3}$ or more, and in some embodiments of about $1E20$ cm$^{-3}$ or more.

In the structure 800B, the drift layer 812 is divided into an upper drift layer 812A and a lower drift layer 812B. The upper drift layer 812A is the portion of the drift layer 812 between the surface of the drift layer 812 and the buried junction structure 840, while the lower drift layer 812B is the portion of the drift layer 812 between the substrate 802 and the buried junction structure 840. The upper drift layer 812A is characterized by a first width $W_{D1}$ between the surface of the drift layer 812 and the upper surface of the buried junction structure 840, and a first doping concentration $N_{D1}$. The lower drift layer 812B is characterized by a second width $W_{D2}$ between the substrate 802 and the upper surface of the buried junction structure 840, and having a second doping concentration $N_{D2}$.

Figure 10:
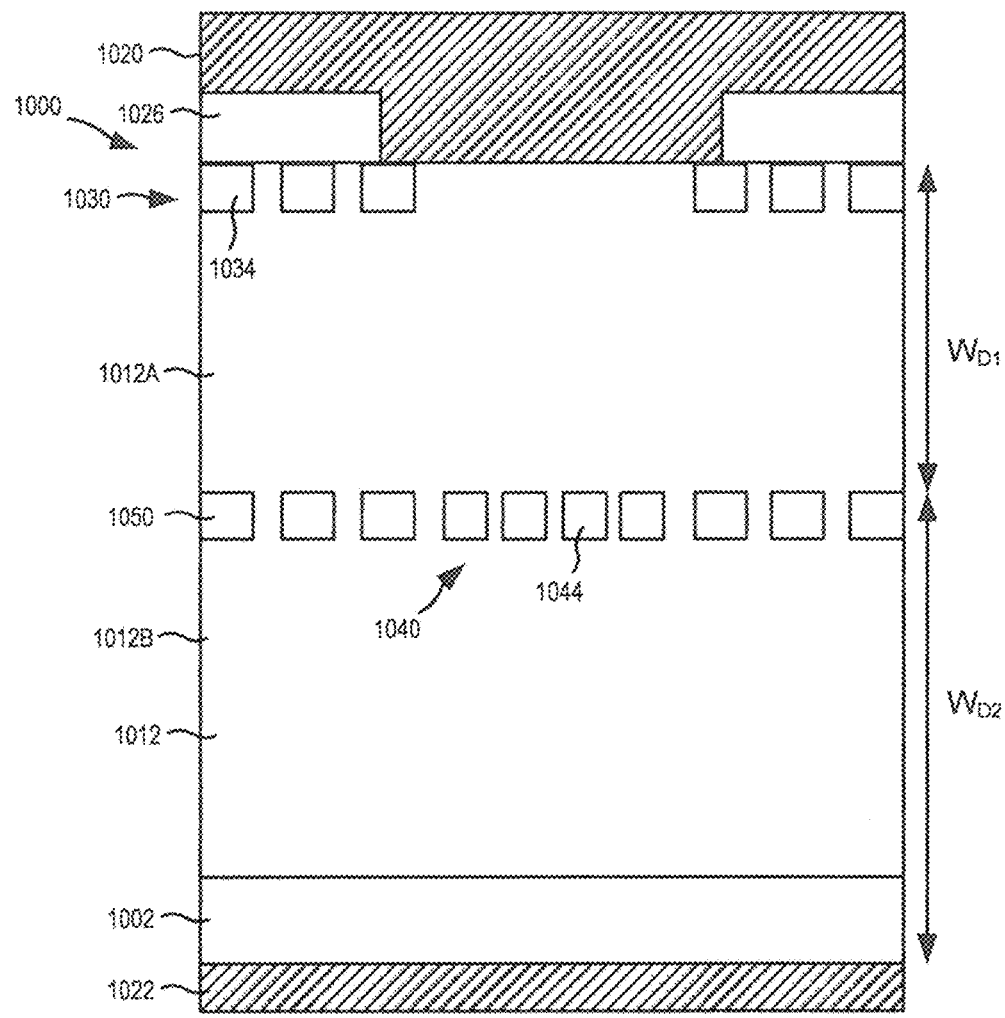
Figure 11:
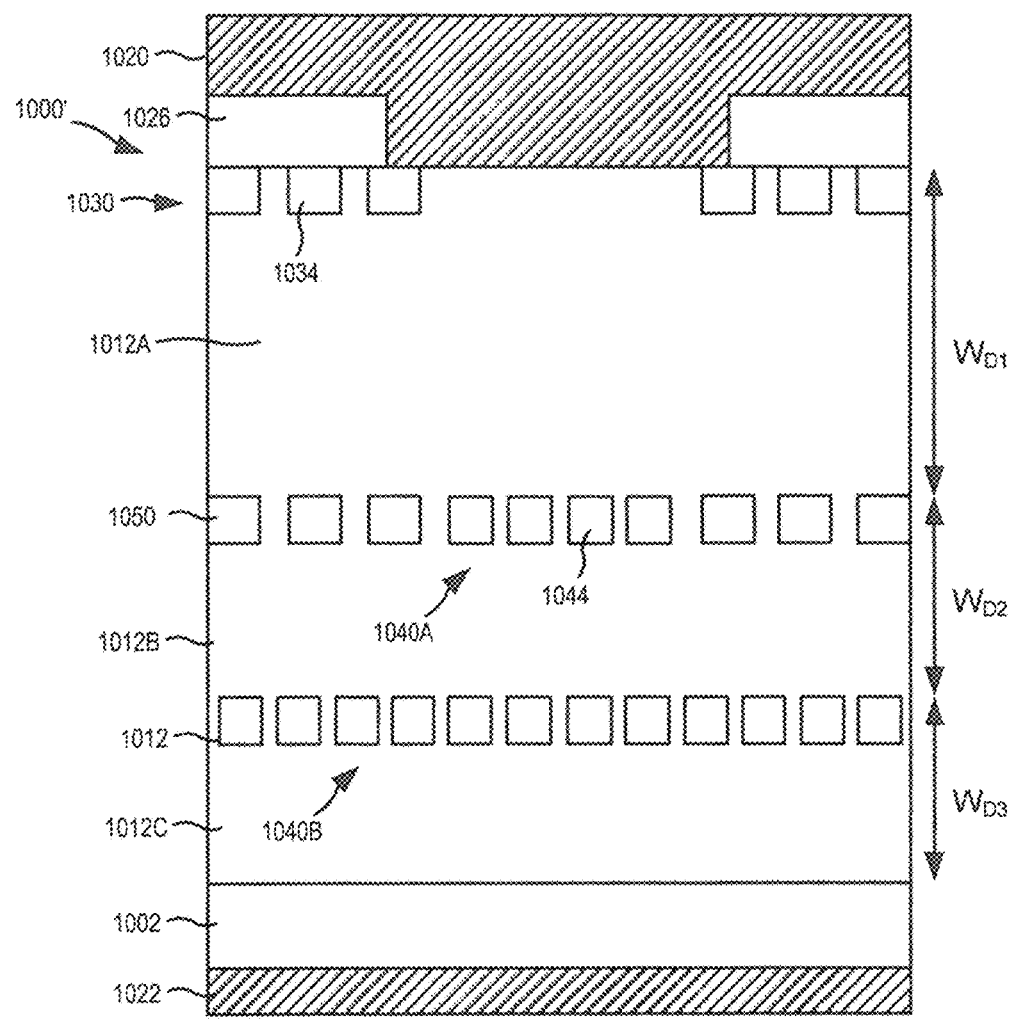

The buried p-type regions 844 are characterized by having a formation depth of $W_{D1}$ (i.e. the thickness of the upper drift layer 812A) and a vertical thickness $x_j$, as illustrated in FIGS. 10 and 11 and discussed in more detail below. That is, the buried p-type regions 844 may be formed at a depth of $W_{D1}$ in the drift layer 812 and may extend to a junction depth of $W_{D1}+x_j$ in the drift layer 812.

Additional buried junction grids 840 can be provided at different depths in the drift layer 802 to further reduce the device on-state resistance.

Buried junction structures have been experimentally demonstrated in both Si and 4H—SiC, however, their formation in 4H—SiC is made difficult by the limited diffusivity and implantation range of acceptor ions that are used to form the buried junction. Deep junctions are desirable to reduce the radius of curvature (R) of the junction, which in turn reduces the electric field crowding in the off state, and increases the device breakdown voltage. The radius of curvature of the structure refers to the distance between the junction depth of the deepest buried p-type region 844 (e.g. at the depth of $W_{D1}+x_j$ for a device structure having a single buried junction structure 840) and the substrate 802. Stated differently, the radius of curvature for a device structure may be about equal to $W_{D2}-x_j$, where $x_j$ is the thickness of the lowest buried junction structure 840.

Some embodiments use ion channeling to form deep buried p-type regions 844 in a silicon carbide drift layer of an electronic device. In some embodiments, the implants may be used to form the buried p-type regions at a formation depth $W_{D1}$ of greater than about 1 micron, and to have a thickness $x_j$ of about 0.1 microns to 3 microns. Accordingly, in some embodiments, the junction depth of the buried p-type regions 844 may be greater than about 1 micron. In further embodiments, the junction depth of the buried p-type regions 844 may be greater than about 2 microns, and in still further embodiments greater than about 4 microns.

As discussed above, ion implantation is typically performed at a so called "random" angle with respect to the crystal orientation, to ensure that collisions between ions and the atoms that make up the crystal are randomized and providing a well-controlled Gaussian doping profile. However, if the angle of the incident beam is tightly controlled with respect to the crystal, it is possible to align the beam with the crystal planes such that the implanted ions stop at a much deeper range than would be possible using a randomized implant process.

Traditionally, deep junctions in 4H—SiC (e.g. junctions deeper than about 1 micron) have been formed using high energy/high dose ion implants. This process is undesirable for formation of buried junctions in high voltage devices for two reasons. For example, high energy/dose implants cause damage to the epitaxial drift layer. The crystal defects that are created by this damage can serve as carrier generation centers when a device is in the blocking state, potentially resulting in high leakage currents. Second, the damage caused by high energy/dose implants can also change the morphology of the surface of the epitaxial layer. Subsequent epitaxial growth can be negatively impacted by the surface damage induced by the ion implants. This can also result in unacceptably high levels of leakage currents in the off-state of the device.

Junctions formed using implant channeling as described herein can achieve deep profiles without the use of high energies and doses, and may therefore be free from either of these undesirable effects, while maintaining the low radius of curvature of a deep junction. This is especially important for high voltage (>3 kV) devices, where the drill region is long with respect to the junction depth. In addition, even with high energies and doses, the greatest practically achievable junction depth using standard semiconductor manufacturing technology is approximately 1 micron in 4H—SiC using aluminum as an implant species. This is very small compared to drift layer thicknesses that are used in high voltage devices, which range from 15 microns thick, up to 200 (or more) microns thick.

Figure 7:
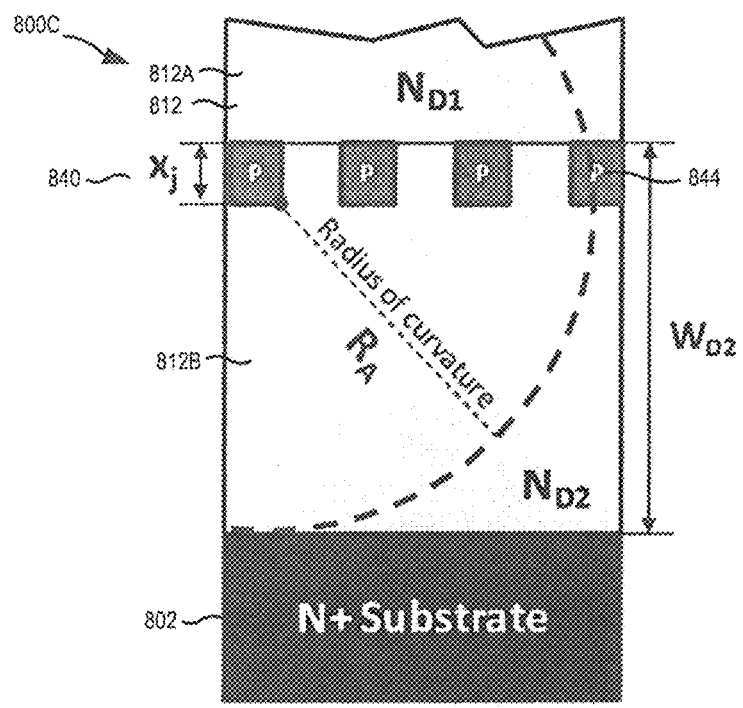
FIG. 7 is a schematic block diagram illustrating portions of a DMOSFET structure including a buried junction according to some embodiments.

An example cross section detail of portions of a buried junction device 800C formed using standard ion implants is shown in FIG. 7. The device 800C has a junction depth of about 1 micron or less. This means that the device has a radius of curvature $R_A$ equal to the $W_{D2}-x_j$, where $W_{D2}=W_1-W_{D1}$, and $W_1$ is the overall thickness of the drift layer. However, because $W_{D1}+x_j$ is less than 1 micron, the value of $W_{D2}$ remains relatively large.

Figure 8:
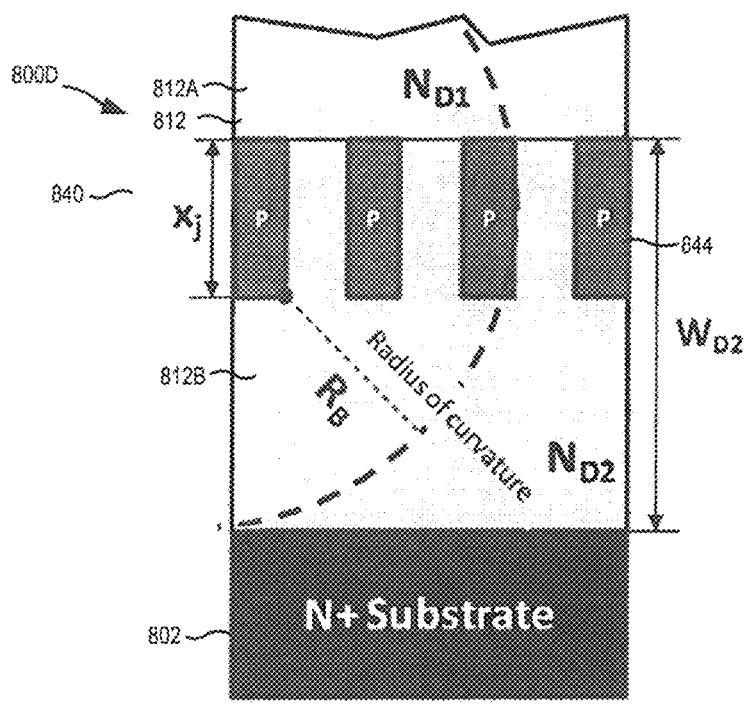
FIG. 8 is a schematic block diagram illustrating portions of a DMOSFET structure including a buried junction according to further embodiments.

Channeled implants can enable the formation of a deep junction, i.e. a junction with a junction depth ($W_{D1}+x_j$) greater than 1 micron, without the use of high implant energies and/or high implant doses. An example cross section of a portions of a buried junction device 800D containing a deep junction formed using channeled ion implants is shown in FIG. 8. As can be seen in FIG. 8, the radius of curvature $R_B$ can be significantly reduced when the junction depth is increased. As noted above, decreasing the radius of curvature can reduce electric field crowding in the off state, and increase the device breakdown voltage.

Reference is again made to FIG. 4, which shows the concentration profile of an on-axis implant performed in 4H—SiC using low doses and moderate energies, and therefore low implant damage. The doping concentrations shown in FIG. 4 are appropriate for use in a buried P+ grid. The high junction depth may mitigate junction curvature effects and thereby increase device breakdown voltages.

Example embodiments include devices with a single deep P+ grid embedded in the middle of a power device's N-type drift region, formed using either a single channeled ion implant or a series of channeled ion implants. For example, some embodiments may be applicable to any power electronics switch or diode with either an N-type or P-type drift region, such as MOSFETs and Schottky diodes (including junction barrier Schottky devices), as well as JFETs and high voltage BJTs that operate predominantly in the unipolar mode. Some embodiments may be particularly useful in the fabrication of power semiconductor devices having blocking voltages of 2 kV or greater.

Some embodiments may also be applied to bipolar devices, such as PiN diodes, IGBTs, and thyristors that have the added advantage of reduced resistance at high temperatures Some embodiments may be used to form devices having the opposite polarity as those illustrated in FIGS. 5-8. For example, in some embodiments, an n+ buried grid may be formed in a p-type drift region.

The buried junction structure 840 and/or the buried regions 844 can either be aligned to structures on the top or bottom of the drift region 812, or not aligned to any structures.

Figure 9:
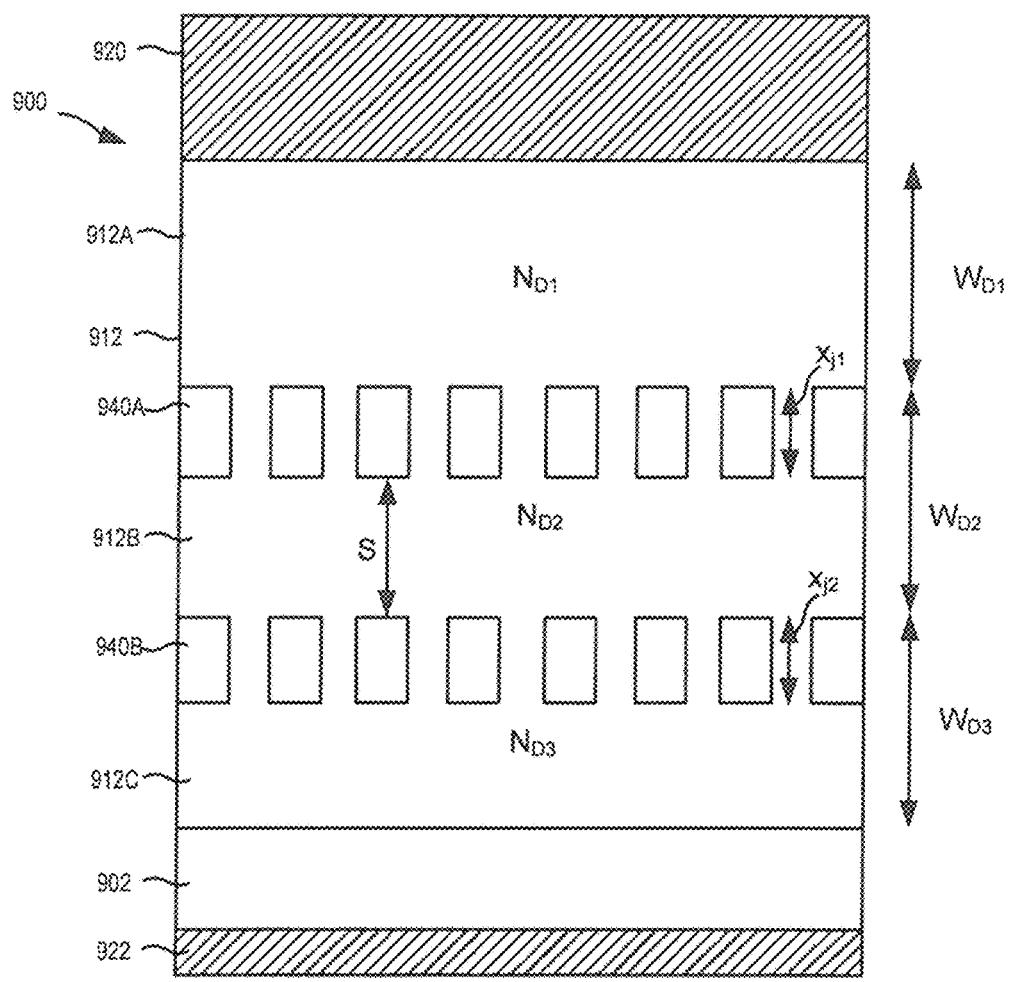
FIGS. 9 to 11 are schematic blocks diagram illustrating semiconductor devices according to various embodiments.

Some embodiments include devices with more than one p+ (or n+) buried junction structure formed using channeled ion implants embedded, splitting the drift region into three or more parts, as illustrated in FIG. 9.

FIG. 9 illustrates a Schottky diode structure 900 including a plurality of buried junction structures. The device 900 includes an n+4H—SiC substrate 902 on which an n-type drift layer 912 is formed. A Schottky contact 920 is formed on the drift layer 912 opposite the substrate 902, and a cathode contact 922 is formed on the substrate 902. A first buried junction structure 940A is formed in the device at a first junction depth of $W_{D1}+x_{j1}$, while a second buried junction structure 940B is formed in the device at a second junction depth of $W_{D1}+W_{D2}+x_{j2}$. The first junction depth and/or the second junction depth may be greater than 1 micron. In some embodiments, the first junction depth and/or the second junction depth may be greater than 2 microns, and in further embodiments greater than 4 microns. The first and second buried junction structures may be formed using channeled ion implantation as described herein, and may be formed using one implant step or multiple implant steps.

The first and second buried junction structures 940A, 940B may divide the drift layer 912 into a first drift layer portion 912A, a second drill layer portion 912B, and a third drift layer portion 912C. The first, second and third drift layer portions may have thicknesses of $W_{D1}$, $W_{D2}$ and $W_{D3}$, respectively, and doping concentrations of $N_{D1}$, $N_{D2}$ and $N_{D3}$, respectively. The thicknesses $W_{D1}$, $W_{D2}$ and $W_{D3}$ may be the same and/or different from one another. Likewise, the doping concentrations $N_{D1}$, $N_{D2}$ and $N_{D3}$ may be the same and/or different from one another.

The first and second buried junction structures 940A, 940B may be spaced apart by a vertical spacing S that is equal to $W_{D2}-x_{j1}$. In some embodiments, the spacing S may be from about 0.1 microns to about 3 microns.

Although two buried junction structures 940A, 940B are shown in FIG. 9, devices according to some embodiments may include more than two buried junction structures having different junction depths, different spacings, different thicknesses and/or doping concentrations.

Devices according to further embodiments include edge termination structures formed using channeled ion implants in the middle of the drift region (away from the active region). Edge termination structures may be either guard ring type, formed using the same energy/dose as the P+ grid, JTE type, formed using a lower dose and different pattern, or a combination thereof. Edge termination structures may be aligned to the center buried junction structure formed using channeled ion implants.

For example, FIG. 10 illustrates a Schottky diode structure 1000 including a buried junction structure 1040 and a buried edge termination structure 1030. The device 1000 includes an n+ 4H—SiC substrate 1002 on which an n-type drift layer 1012 is formed. A Schottky contact 1020 is formed on the drift layer 1012 opposite the substrate 1002, and a cathode contact 1022 is formed on the substrate 1002. A buried junction structure 1040 including a plurality of doped regions 1044 is formed in the device at a junction depth of $W_{D1}+x_{j1}$ and divides the drift layer into an upper drift layer 1012A and a lower drift layer 1012B. The junction depth may be greater than 1 micron. In some embodiments, the junction depth may be greater than 2 microns, and in further embodiments greater than 4 microns. The buried junction structure may be formed using channeled ion implantation as described herein, and may be formed using one implant step or multiple implant steps.

The device further includes an edge termination 1030 outside the active region of the device as defined by a field oxide 1026. The edge termination 1030 includes a plurality of implanted regions 1034 having a conductivity type opposite the conductivity type of the drift layer 1012.

FIG. 11 illustrates a device structure 1000' that is similar to the structure 1000 shown in FIG. 10, except that the device 1000' includes vertically spaced buried junction structures 1040A, 1040B that have different junction depths and that divide the drift layer 1012 into an upper drift layer 1012A, a middle drift layer 1012B and a lower drift layer 1012C.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments and, although specific terms are employed, they are used in a generic and descriptive sense only and not for purposes of limitation, the scope of the inventive concepts being set forth in the following claims.

That which is claimed is:
1. A semiconductor device, comprising:
a silicon carbide substrate having a first conductivity type;
a silicon carbide drift layer having the first conductivity type on the silicon carbide substrate and having an upper surface opposite the silicon carbide substrate; and
a buried junction structure in the silicon carbide drift layer, wherein the buried junction structure comprises floating regions having a second conductivity type opposite the first conductivity type;
wherein the buried junction structure comprises a first buried junction structure having a first junction depth, and wherein the semiconductor device further comprises a second buried junction structure having a second junction depth that is greater than the first junction depth; and wherein a distance between the first buried junction structure and the second buried junction structure is about 0.1 micron to about 3 microns.

2. The semiconductor device of claim 1, wherein the first and second buried junction structures are electrically isolated from one another.

3. The semiconductor device of claim 1, wherein the silicon carbide drift layer comprises an upper drift layer and a lower drift layer separated by the buried junction structure, wherein the lower drift layer is between the substrate and the upper drift layer, and wherein the upper drift layer has a thickness that is greater than about one micron.

4. The semiconductor device of claim 3, wherein the buried junction structure has a junction depth, and wherein the semiconductor device has a radius of curvature that is equal to a thickness of the lower drift layer less the first junction depth, wherein the radius of curvature is less than a lateral width of the lower drift layer.

5. The semiconductor device of claim 1, wherein the first junction depth is greater than about 2 microns.

6. The semiconductor device of claim 1, wherein the first junction depth is greater than about 4 microns.

7. The semiconductor device of claim 1, wherein the buried junction structure comprises a plurality of buried regions arranged in a grid.

8. A semiconductor device, comprising:
a silicon carbide substrate having a first conductivity type;
a silicon carbide drift layer having the first conductivity type on the silicon carbide substrate and having an upper surface opposite the silicon carbide substrate; and
a buried junction structure in the silicon carbide drift layer, wherein the buried junction structure comprises a plurality of first regions having a second conductivity type opposite the first conductivity type, wherein the first regions are electrically isolated from one another by a material of the drift layer;
wherein the buried junction structure comprises a first buried junction structure having a first junction depth, and wherein the semiconductor device further comprises a second buried junction structure having a second junction depth that is greater than the first junction depth; and
wherein a distance between the first buried junction structure and the second buried junction structure is about 0.1 micron to 3 microns.

9. The semiconductor device of claim 8, wherein the silicon carbide drift layer comprises an upper drift layer and a lower drift layer separated by the buried junction structure, wherein the lower drift layer is between the substrate and the upper drift layer, and wherein the upper drift layer has a thickness that is greater than about one micron.

10. The semiconductor device of claim 9, wherein the semiconductor device has a radius of curvature that is equal to a thickness of the lower drift layer less the second junction depth of the second buried junction structure, wherein the radius of curvature is less than a lateral width of the lower drift layer.

11. The semiconductor device of claim 8, wherein the first junction depth is greater than about 2 microns.

12. The semiconductor device of claim 8, wherein the first junction depth is greater than about 4 microns.

* * * * *